(12) United States Patent
Kang et al.

(10) Patent No.: US 7,933,154 B2
(45) Date of Patent: Apr. 26, 2011

(54) NON-VOLATILE MEMORY DEVICE FOR REDUCING LAYOUT AREA OF GLOBAL WORDLINE DECODER AND OPERATION METHOD THEREOF

(75) Inventors: Myoung Gon Kang, Suwon-si (KR); Ki Tae Park, Seongnam-si (KR); Doo Gon Kim, Hwaseong-si (KR); Yeong Taek Lee, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 299 days.

(21) Appl. No.: 12/213,937

(22) Filed: Jun. 26, 2008

(65) Prior Publication Data
US 2009/0003067 A1 Jan. 1, 2009

(30) Foreign Application Priority Data
Jun. 27, 2007 (KR) .................. 10-2007-0063621

(51) Int. Cl.
*G11C 16/06* (2006.01)
*G11C 16/08* (2006.01)
*G11C 16/10* (2006.01)
*G11C 16/12* (2006.01)

(52) U.S. Cl. ......... 365/185.18; 365/185.11; 365/185.13; 365/185.23; 365/185.24; 365/185.17

(58) Field of Classification Search ............ 365/185.11, 365/185.13, 185.23, 185.24, 185.17, 185.18
See application file for complete search history.

(56) References Cited

U.S. PATENT DOCUMENTS

| 6,865,114 | B2 | 3/2005 | Pio | |
|---|---|---|---|---|
| 7,151,686 | B2 | 12/2006 | Sugimae et al. | |
| 2004/0080980 | A1* | 4/2004 | Lee | 365/185.17 |
| 2005/0180213 | A1* | 8/2005 | Abe et al. | 365/185.17 |
| 2007/0171719 | A1* | 7/2007 | Hemink et al. | 365/185.14 |

FOREIGN PATENT DOCUMENTS
KR 10-2007-0018216 A 2/2007
* cited by examiner

*Primary Examiner* — J. H. Hur
(74) *Attorney, Agent, or Firm* — Lee & Morse, P.C.

(57) ABSTRACT

A non-volatile memory device includes a memory cell array from which data is read via a plurality of bitlines, which includes a plurality of memory cells having gates respectively connected with a plurality of wordlines, a first type global wordline decoder configured to selectively apply n different voltages, where n is an integer greater than or equal to 3, to a corresponding wordline of the plurality of wordlines in a program mode, and a second type global wordline decoder configured to selectively apply (n−1) different voltages to a corresponding wordline of the plurality of wordlines in the program mode, the second type global wordline decoder having fewer switching elements than the first type global wordline decoder.

20 Claims, 14 Drawing Sheets

FIG. 5

|  | DWL1 Decoder | WL[0] Decoder | Normal WL (WL[1]~WL[30]) Decoder | WL[31] Decoder | DWL2 Decoder |
|---|---|---|---|---|---|
| Switch1 | – | Vpgm | Vpgm | Vpgm | – |
| Switch2 | Vpass | Vpass | Vpass | Vpass | Vpass |
| Switch3 | VBias1 | VBias1 | VBias1 | – | – |
| Switch4 | VBias2 | VBias2 | VBias2 | – | – |
| Switch5 | – | – | VBias3 | VBias3 | VBias3 |

FIG. 6

| | DWL1 Select | WL[0] Select | WL[1] Select | WL[2] Select | WL[3] Select | WL[4]~Select~ | WL[30] Select | WL[31] Select | DWL2 Select |
|---|---|---|---|---|---|---|---|---|---|
| DWL2 | Vpass | Vpass | Vpass | Vpass | Vpass | ... | Vpass | VBias3 | — |
| WL[31] | Vpass | Vpass | Vpass | Vpass | Vpass | ... | VBias3 | Vpgm | Vpass |
| WL[30] | Vpass | Vpass | Vpass | Vpass | Vpass | ... | Vpgm | VBias2 | Vpass |
| WL[29]~WL[3] | ... | ... | ... | ... | ... | ... | ... | ... | ... |
| WL[2] | Vpass | Vpass | VBias3 | Vpgm | VBias2 | ... | Vpass | Vpass | Vpass |
| WL[1] | Vpass | VBias3 | Vpgm | VBias2 | VBias1 | ... | Vpass | Vpass | Vpass |
| WL[0] | Vpass | Vpgm | VBias2 | VBias1 | Vpass | ... | Vpass | Vpass | Vpass |
| DWL1 | — | VBias2 | VBias1 | Vpass | Vpass | ... | Vpass | Vpass | Vpass |

FIG. 9

|  | DWL1 Decoder | WL[0] Decoder | Normal WL (WL[1]~WL[30]) Decoder | WL[31] Decoder | DWL2 Decoder |
|---|---|---|---|---|---|
| Switch1 | Vpgm | Vpgm | Vpgm | Vpgm | Vpgm |
| Switch2 | Vpass | Vpass | Vpass | Vpass | Vpass |
| Switch3 | VBias2 | VBias2 | VBias2 | – | – |
| Switch4 | – | – | VBias3 | VBias3 | VBias3 |

FIG. 10

| | DWL1 Select | WL[0] Select | WL[1] Select | WL[2] Select | WL[3] Select | WL[4] Select~ | WL[30] Select | WL[31] Select | DWL2 Select |
|---|---|---|---|---|---|---|---|---|---|
| DWL2 | Vpass | Vpass | Vpass | Vpass | Vpass | ... | Vpass | VBias3 | Vpgm |
| WL[31] | Vpass | Vpass | Vpass | Vpass | Vpass | ... | VBias3 | Vpgm | Vpass |
| WL[30] | Vpass | Vpass | Vpass | Vpass | Vpass | ... | Vpgm | VBias2 | Vpass |
| WL[29]~WL[3] | ... | ... | ... | ... | ... | ... | ... | ... | ... |
| WL[2] | Vpass | Vpass | VBias3 | Vpgm | VBias2 | ... | Vpass | Vpass | Vpass |
| WL[1] | Vpass | VBias3 | Vpgm | VBias2 | Vpass | ... | Vpass | Vpass | Vpass |
| WL[0] | Vpass | Vpgm | VBias2 | Vpass | Vpass | ... | Vpass | Vpass | Vpass |
| DWL1 | Vpgm | Vpass | Vpass | Vpass | Vpass | ... | Vpass | Vpass | Vpass |

NON-VOLATILE MEMORY DEVICE FOR REDUCING LAYOUT AREA OF GLOBAL WORDLINE DECODER AND OPERATION METHOD THEREOF

BACKGROUND OF THE INVENTION

1. Field of the Invention

Embodiments relate to a non-volatile memory device. More particularly, embodiments relate to a global wordline decoder for reducing an area of a non-volatile memory device and a decoding method thereof.

2. Description of the Related Art

Examples of a non-volatile memory device include a mask read-only memory (ROM), an electrically erasable programmable ROM (EEPROM), and an erasable programmable ROM (EPROM). EEPROMs are widely used for system programming requiring continuous update or for auxiliary storage. A flash EEPROM (hereinafter, referred to as a "flash memory device") has a higher degree of integration than a conventional EEPROM, and thus typically used as a large-capacity auxiliary storage device.

Operation modes of a non-volatile memory device may be generally divided into a program mode, an erase mode, and a read mode. In the non-volatile memory device, various voltages are applied to wordlines and bitlines according to the operation modes. For instance, in the program mode, a program voltage is applied to a selected wordline and another voltage is applied to non-selected wordlines.

In order to selectively apply these voltages to wordlines, a plurality of switch elements (for example, switching transistors) are needed in a wordline decoder. For instance, as many switching transistors as the number of wordlines are required, and a large layout area for the switching transistors is required in the wordline decoder. Accordingly, an approach for reducing the layout area by reducing the number of switching transistors in the wordline decoder is desired.

SUMMARY OF THE INVENTION

Embodiments are therefore directed to a non-volatile memory device and an operation method thereof, which substantially overcomes one or more of the problems and disadvantaged of the related art.

It is therefore a feature of an embodiment to provide a non-volatile memory device having a reduced layout area by dividing global wordline decoders into types according to a number of voltages to be applied there from to wordlines, and an operation method thereof.

At least one of the above and other features and advantages may be realized by providing a non-volatile memory device including a plurality of wordlines, a plurality of bitlines, a memory cell array, a first type global wordline decoder, and a second type global wordline decoder. The memory cell array, from which data is read via the plurality of bitlines, includes a plurality of memory cells having gates respectively connected to the plurality of wordlines. The first type global wordline decoder selectively applies n different voltages, where n is an integer greater than or equal to three, to a corresponding wordline of the plurality of wordlines in a program mode. The second type global wordline decoder selectively applies up to (n−1) different voltages a corresponding wordline of the plurality of wordlines in the program mode. The second type global wordline decoder includes fewer switching elements than the first type global wordline decoder. The n different voltages include a program voltage for programming a selected cell among the plurality of memory cells, a program inhibit voltage lower than the program voltage, and at least one bias voltage lower than the program inhibit voltage.

The switching elements may be implemented by switching transistors. The first type global wordline decoder may include a plurality of switching transistors for respectively switching the n different voltages. The second type global wordline decoder may include a plurality of switching transistors for respectively switching the rest of the up to (n−1) different voltages.

The at least one bias voltage may include a downward bias voltage applied to a first adjacent cell of the selected cell and a upward bias voltage applied to a second adjacent cell of the selected cell. The second type global wordline decoder may include a first edge global wordline decoder configured to selectively apply up to (n−1) different voltages, excluding at least the upward bias voltage, to a corresponding wordline of the plurality of wordlines in the program mode, and a second edge global wordline decoder configured to selectively apply up to (n−1) different voltages, excluding the downward bias voltage, to a corresponding wordline of the plurality of wordlines in the program mode.

The plurality of memory cells may include first through N-th memory cells connected in series in a string structure, a first dummy cell, and a second dummy cell, where N is 2 or an integer greater than 2. The at least one bias voltage may include a first downward bias voltage applied to the (i−1)-th memory cell and a first upward bias voltage applied to the (i+1)-th memory cell when the selected cell is the i-th memory cell among the first through N-th memory cells where "i" is an integer and $1 \leq i \leq N$.

At least one of the above and other features and advantages may be realized by providing an operation method of a non-volatile memory device including a memory cell array, from which data is read via a plurality of bitlines and which includes a plurality of memory cells having gates respectively connected to a plurality of wordlines. The operation method includes selectively applying n different voltages, where n is an integer greater than or equal to three, to a first corresponding wordline among the plurality of wordlines in a program mode using a first type global wordline decoder, and selectively applying up to (n−1) different voltages except at least one voltage to a second corresponding wordline among the plurality of wordlines in the program mode using a second type global wordline decoder, which includes fewer switching elements than the first type global wordline decoder. The n different voltages include a program voltage for programming a selected cell among the plurality of memory cells, a program inhibit voltage lower than the program voltage, and at least one bias voltage lower than the program inhibit voltage.

BRIEF DESCRIPTION OF THE DRAWINGS

The above and other features and advantages will become more apparent to those of ordinary skill in the art by describing in detail exemplary embodiments thereof with reference to the attached drawings, in which:

FIG. 5 illustrates a table of switching transistors required for each of a plurality of global wordline decoders illustrated in FIG. 3 in the program mode;

FIG. 6 illustrates a table of voltages applied to wordlines in the program mode, according to some embodiments of the present invention;

FIG. 9 illustrates a table of switching transistors required for each of a plurality of global wordline decoders illustrated in FIG. 8 in the program mode; and FIG. 10 illustrates a table of voltages applied to wordlines in the program mode, according to other embodiments of the present invention.

DETAILED DESCRIPTION OF THE INVENTION

Figure 1:
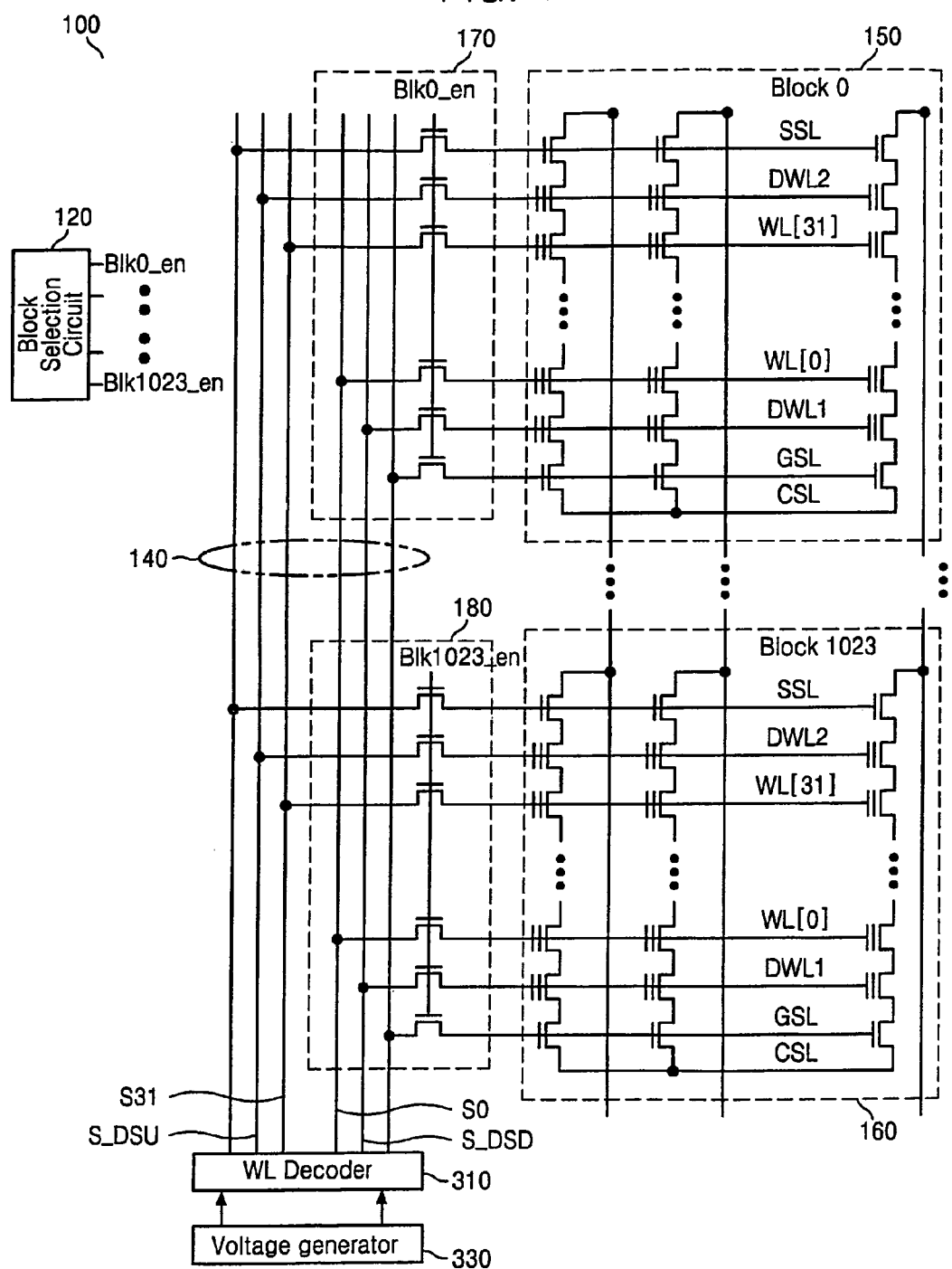
FIG. 1 illustrates a core of a NAND flash memory device according to some embodiments of the present invention.

Korean Patent Application No. 10-2007-0063621, filed on Jun. 27, 2007, in the Korean Intellectual Property Office, and entitled: "Non-Volatile Memory Device for Reducing Layout Area of Global Wordline Decoder and Operation Method Thereof," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 illustrates a core 100 of a NAND flash memory device according to some embodiments of the present invention. The core 100 may include a block selection circuit 120, a plurality of global wordlines 140, a plurality of memory blocks 150 and 160, a plurality of block selection switching transistors 170 and 180, a global wordline decoder 310, and a voltage generator 330.

The block selection circuit 120 may select one of the memory blocks 150 and 160. For instance, the block selection circuit 120 may generate a block selection signal Blk0_en or Blk1023_en based on an address signal to select one of the memory blocks 150 and 160. The global wordlines 140 may transmit signals output from the global wordline decoder 310 to the block selection switching transistors 170 and 180. The memory blocks 150 and 160 may include a plurality of non-volatile memory cells connected with the wordlines WL[0]~[31], DWL1, and DWL2.

The block selection switching transistors 170 and 180 may be turned on in response to the block selection signal Blk0_en or Blk1023_en output from the block selection circuit 120, and may apply one voltage among voltages, e.g., a program voltage, a downward bias voltages, a upward bias voltage, a program inhibit voltage, and so forth, output from the global wordline decoder 310 to a corresponding wordline among the global wordlines 140. The global wordline decoder 310 may output voltages, e.g., the program voltage, the downward bias voltages, the upward bias voltage, the program inhibit voltage, and so forth, output from the voltage generator 330 to the global wordlines 140 via internal switching transistors respectively corresponding to the global wordlines 140.

The global wordlines 140 may be connected to switching transistors, respectively, in each of the block selection switching transistors 170 and 180. In other words, the global wordlines 140 may be respectively connected to wordlines in each of the memory blocks 150 and 160 via the block selection switching transistor 170 or 180.

The voltage generator 330 may generate a plurality of voltages necessary for programming data to, erasing data from, and reading data from memory cells. The plurality of voltages may include the program voltage, the downward bias voltages, the upward bias voltage, and the program inhibit voltage.

Figure 2:
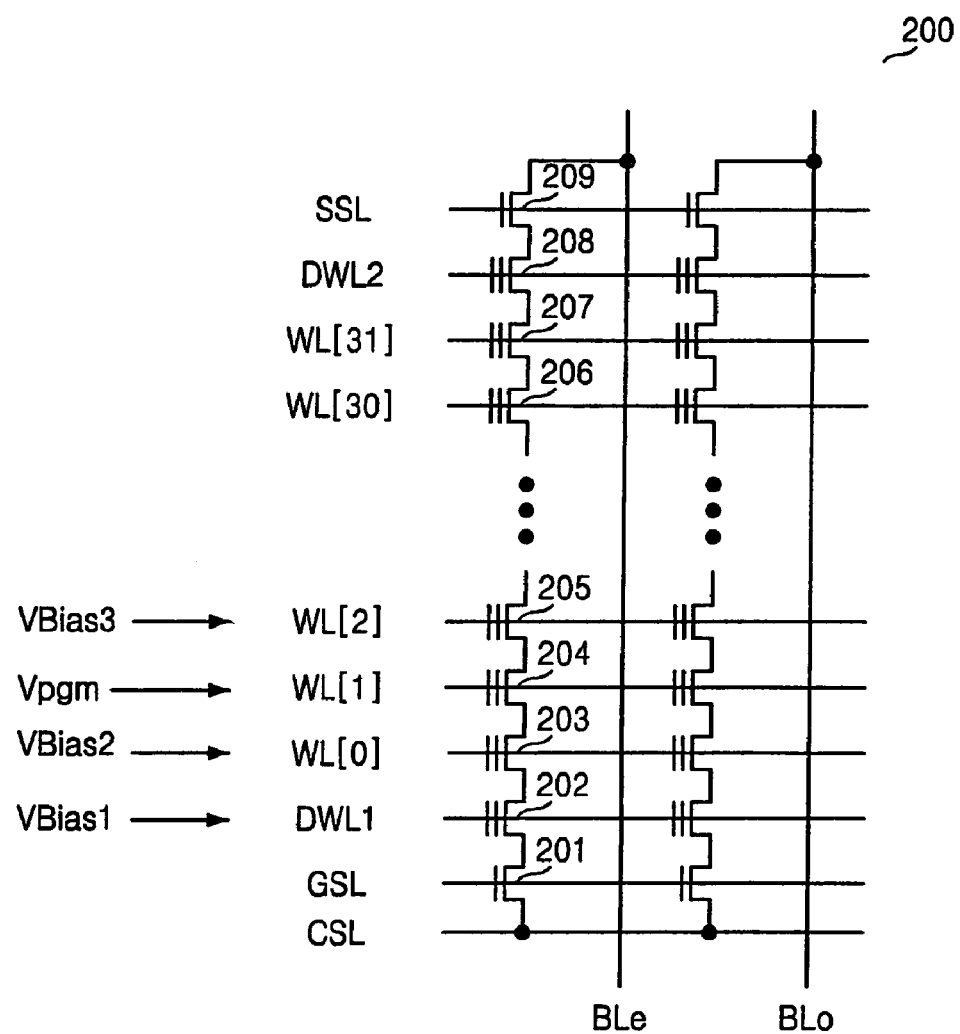
FIG. 2 illustrates voltages applied to a NAND flash string structure in a program mode, according to some embodiments of the present invention.

FIG. 2 illustrates voltages applied to a NAND flash string structure in a program mode, according to some embodiments of the present invention.

Referring to FIG. 2, each of the memory blocks 150 and 160 may include a plurality of bitlines BLe and BLo, a plurality of normal wordlines WL[0] through WL[31], first and second dummy wordlines DWL1 and DWL2, a string selection line SSL, a ground selection line GSL, and a common source line CSL. In addition, each memory block 150 or 160 may include a string selection transistor 209, a common source line selection transistor 201, and a plurality of memory cells 202 through 208 connected in series between the string selection transistor 209 and the common source line selection transistor 201 in a string structure. The memory cells 202 through 208 in the string structure may be implemented by first through N-th memory cells sequentially connected in series where N is an integer greater than or equal to 2.

For clarity of the description, a cell selected from a cell string 200 in the program mode is referred to as a selected cell (e.g., the cell 204); cells that are not selected and are adjacent to the selected cell 204 are referred to as adjacent non-selected cells 202, 203, and 205; and cells that are not selected and are not adjacent to the selected cell 204 are referred to as non-adjacent non-selected cells 206, 207, and 208.

Programming may be performed by providing a program voltage Vpgm to a gate of the selected cell 204, i.e., the wordline WL[1] connected to the selected cell 204. The selected cell 204 may be one of a plurality of non-volatile memory cells connected in series between the string selection transistor 209 and the common source line selection transistor 201. Here, it is assumed that the selected cell 204 is a memory cell connected to the wordline WL[1].

The adjacent non-selected cells 202, 203, and 205 may include two cells 202 and 203 below the selected cell 204 and one cell 205 above the selected cell 204. Downward bias voltages VBias1 and VBias2 and an upward bias voltage VBias3 may be respectively applied to the adjacent non-selected cells 202, 203, and 205, so that the adjacent non-selected cells 202, 203, and 205 are prevented from being programmed. The downward bias voltages VBias1 and VBias2 and the upward bias voltage VBias3 are lower than a program inhibit voltage Vpass. When the program inhibit voltage Vpass is applied to the adjacent non-selected cells 202, 203, and 205, the program inhibit voltage Vpass of the adjacent non-selected cells 203 and 205 may increase due to coupling between the selected cell 204 and the adjacent non-selected cells 202, 203, and 205. This increasing of the program inhibit voltage Vpass may cause the adjacent non-selected cells 203 and 205 to be programmed, which is undesirable. Moreover, this may cause hot electron injection and gate induced drain leakage (GIDL). For these reasons, the downward bias voltages VBias1 and VBias2 and the upward bias voltage VBias3, which are lower than the program inhibit voltage Vpass, are applied to the adjacent non-selected cells 202, 203, and 205. The number of downward bias voltages VBias1 and VBias2 and upward bias voltage VBias3 may change, and the downward bias voltages VBias1 and VBias2 and the upward bias voltage VBias3 may be the same.

The non-adjacent non-selected cells 206, 207, and 208 may be connected in series with the adjacent non-selected cells 202, 203, and 205. The program inhibit voltage Vpass, lower than the program voltage Vpgm, may be applied to gates of the non-adjacent non-selected cells 206, 207, and 208, thereby preventing the non-adjacent non-selected cells 206, 207, and 208 from being programmed.

Figure 3:
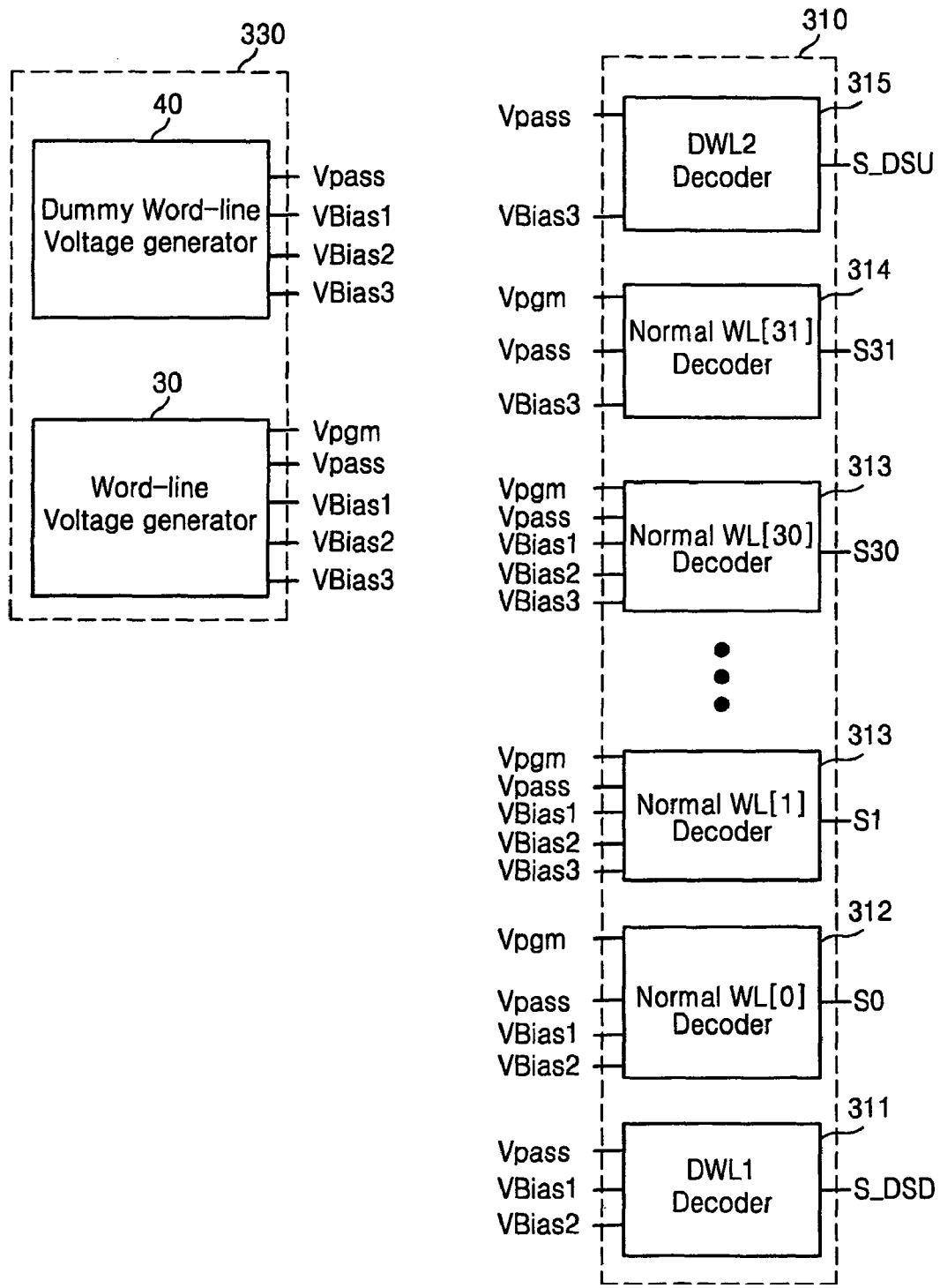
FIG. 3 illustrates a functional block diagram of a global wordline decoder and a voltage generator, according to some embodiments of the present invention.

FIG. 3 illustrates a functional block diagram of the global wordline decoder 310 and the voltage generator 330, according to some embodiments of the present invention. The voltage generator 330 may include a wordline voltage generator 30 and a dummy wordline voltage generator 40. The wordline voltage generator 30 may output voltages, e.g., the program voltage Vpgm, the downward bias voltages VBias1 and VBias2, the upward bias voltage VBias3, and the program inhibit voltage Vpass, which will be applied to the normal wordlines WL[0] through WL[31], to the global wordline decoder 310. The dummy wordline voltage generator 40 may output voltages, e.g., the downward bias voltages VBias1 and VBias2, the upward bias voltage VBias3, and the program inhibit voltage Vpass, which will be applied to the dummy wordlines DWL1 and DWL2, to the global wordline decoder 310.

The global wordline decoder 310 may include a first dummy global wordline decoder 311, a first edge global wordline decoder 312, a plurality of normal global wordline decoders 313, a second edge global wordline decoder 314, and a second dummy global wordline decoder 315. The decoders 311 through 315 may be classified into two types of decoders: a first type global wordline decoder and a second type global wordline decoder. The second type global wordline decoder may include fewer switch elements than the first type global wordline decoder. The first type global wordline decoder may include normal global wordline decoders 313. The second type global wordline decoder may include the first dummy global wordline decoder 311, the first edge global wordline decoder 312, the second edge global wordline decoder 314, and the second dummy global wordline decoder 315 may be classified into the second type global wordline decoder. The switch elements may be implemented by switching transistors, but embodiments are not limited thereto.

Figure 4A:
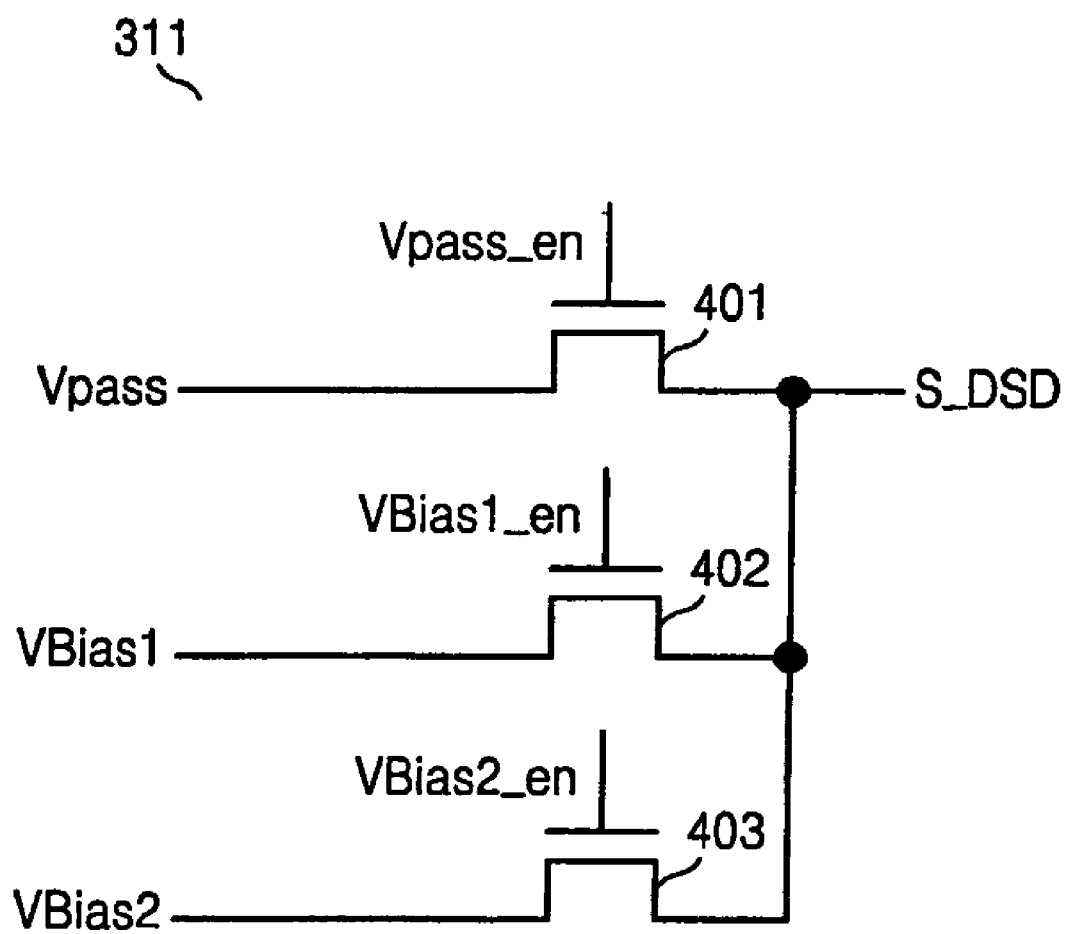
FIG. 4A illustrates a first dummy global wordline decoder illustrated in FIG. 3.

The first dummy global wordline decoder 311 may select one from the voltages (e.g., the program inhibit voltage Vpass and the downward bias voltages VBias1 and VBias2) output from the dummy wordline voltage generator 40 and may output a selected voltage S_DSD. The output voltage S_DSD may be applied to the first dummy wordline DWL1 connected to the first dummy cell 202. FIG. 4A illustrates the first dummy global wordline decoder 311 illustrated in FIG. 3. Referring to FIG. 3 and FIG. 4A, the first dummy global wordline decoder 311 may include three switching transistors 401, 402, and 403 to selectively apply the program inhibit voltage Vpass and the downward bias voltages VBias1 and VBias2 to the first dummy wordline DWL1. The switching transistors 401 through 403 are turned on in response to enable signals Vpass_en, VBias1_en, and VBias2_en, respectively. For example, the switching transistor 401 may turn on the program inhibit enable signal Vpass_en and transmit the program inhibit voltage Vpass as the output voltage S_DSD.

Figure 4B:
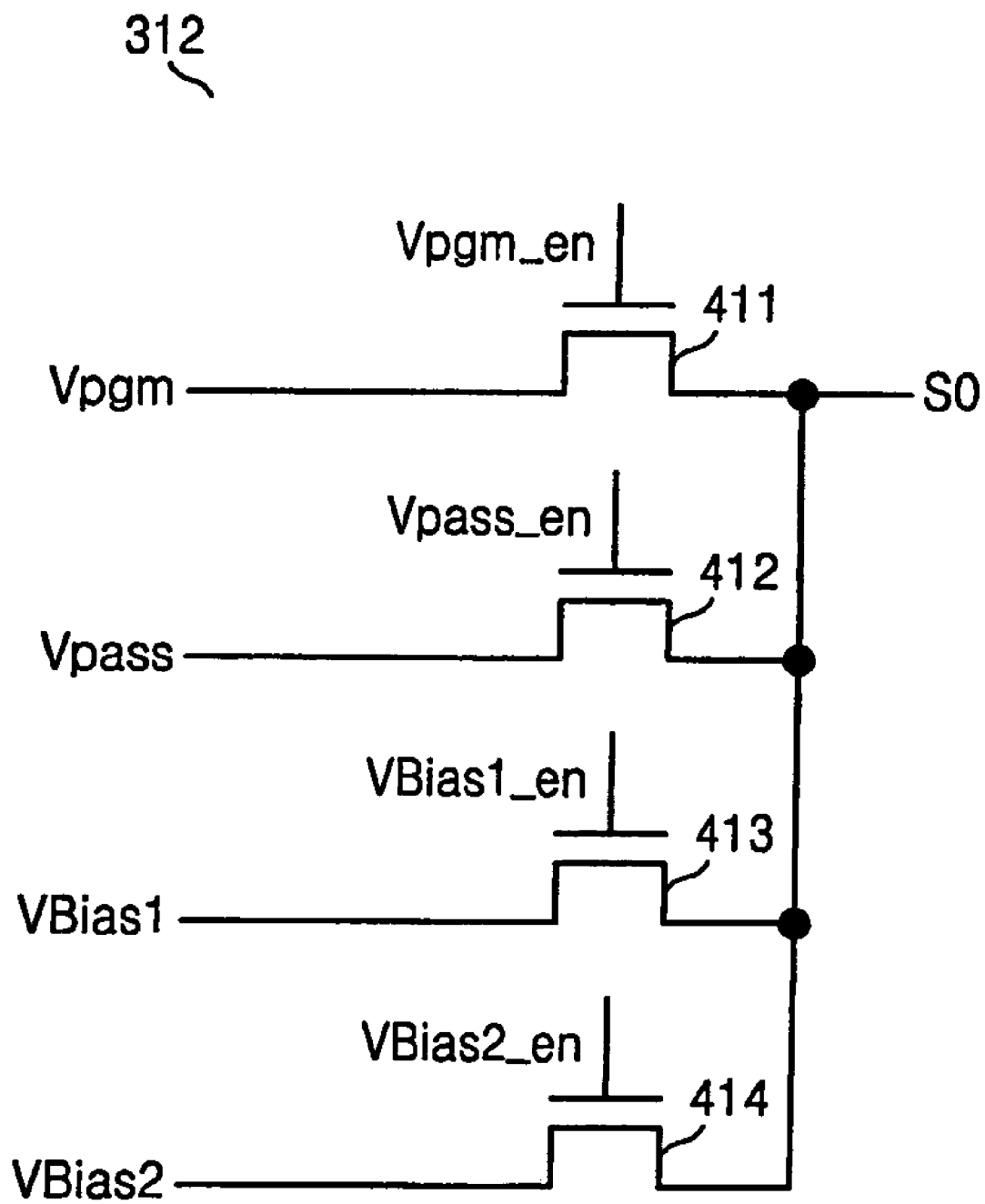
FIG. 4B illustrates a first edge global wordline decoder illustrated in FIG. 3.

The first edge global wordline decoder 312 may select one from the voltages (e.g., the program voltage Vpgm, the program inhibit voltage Vpass, and the downward bias voltages VBias1 and VBias2) output from the wordline voltage generator 30, and may output a selected voltage S0. The output voltage S0 is applied to a first wordline (or a first edge wordline) WL[0] connected to the first edge normal cell 203. FIG. 4B illustrates the first edge global wordline decoder 312 illustrated in FIG. 3. Referring to FIG. 3 and FIG. 4B, the first edge global wordline decoder 312 may include four switching transistors 411, 412, 413, and 414 to selectively apply the program voltage Vpgm, the program inhibit voltage Vpass, and the downward bias voltages VBias1 and VBias2 to the first wordline WL[0]. The switching transistors 411 through 414 may be turned on in response to enable signals Vpgm_en, Vpass_en, VBias1_en, and VBias2_en, respectively.

Figure 4C:
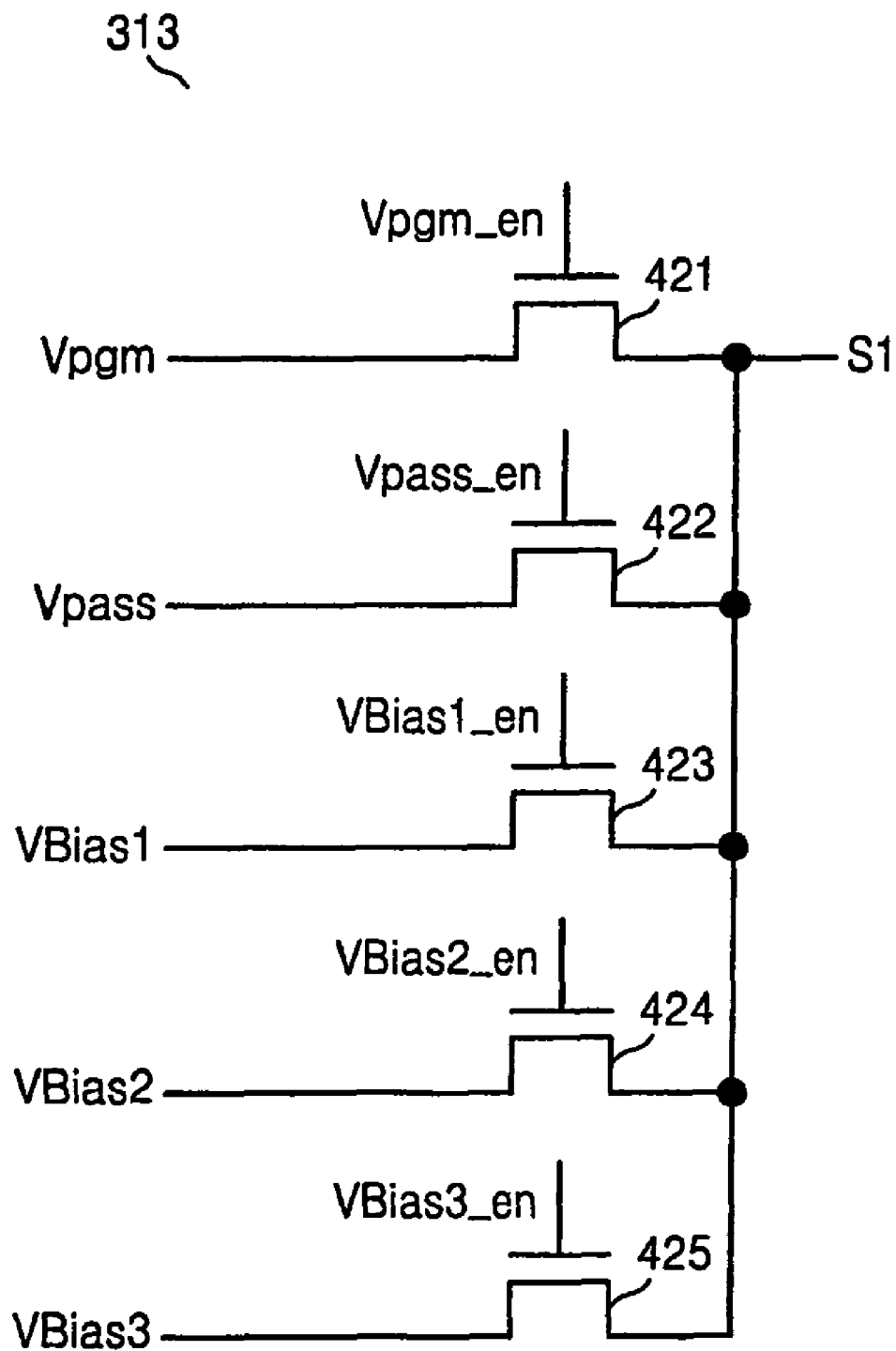
FIG. 4C illustrates a normal global wordline decoder illustrated in FIG. 3.

The normal global wordline decoders 313 may select one from the voltages (e.g., the program voltage Vpgm, the program inhibit voltage Vpass, the downward bias voltages VBias1 and VBias2, and the upward bias voltage VBias3) output from the wordline voltage generator 30, and may output selected voltages S1 through S30. The output voltages S1 through S30 may be respectively applied to a plurality of wordlines WL[1] through WL[30] respectively connected to the normal cells 204 through 206. FIG. 4C illustrates one of the normal global wordline decoders 313 illustrated in FIG. 3. Referring to FIG. 3 and FIG. 4C, the normal global wordline decoder 313 may include five switching transistors 421, 422, 423, 424, and 425 to selectively apply the program voltage Vpgm, the program inhibit voltage Vpass, the downward bias voltages VBias1 and VBias2, and the upward bias voltage VBias3 to a corresponding wordline. The switching transistors 421 through 425 may be turned on in response to enable signals Vpgm_en, Vpass_en, VBias1_en, VBias2_en, and VBias3_en, respectively.

Figure 4D:
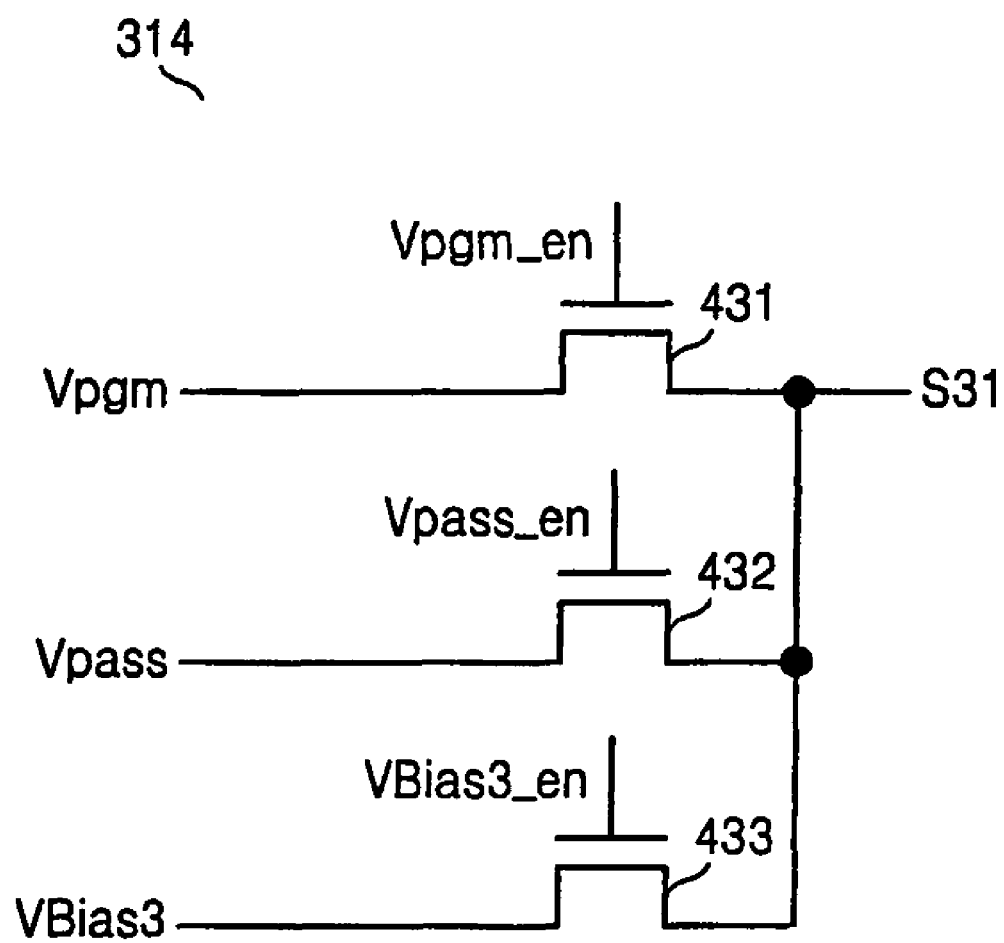
FIG. 4D illustrates a second edge global wordline decoder illustrated in FIG. 3.

The second edge global wordline decoder 314 may select one from the voltages (e.g., the program voltage Vpgm, the program inhibit voltage Vpass, and the upward bias voltage VBias3) output from the wordline voltage generator 30, and may output a selected voltage S31. The output voltage S31 may be applied to a second edge wordline WL[31] connected to the second edge normal cell 207. FIG. 4D illustrates the second edge global wordline decoder 314 illustrated in FIG. 3. Referring to FIG. 3 and FIG. 4D, the second edge global wordline decoder 314 may include three switching transistors 431, 432, and 433 to selectively apply the program voltage Vpgm, the program inhibit voltage Vpass, and the upward bias voltage VBias3 to the second edge wordline WL[31]. The switching transistors 431 through 433 may be turned on in response to enable signals Vpgm_en, Vpass_en, and VBias3_en, respectively.

Figure 4E:
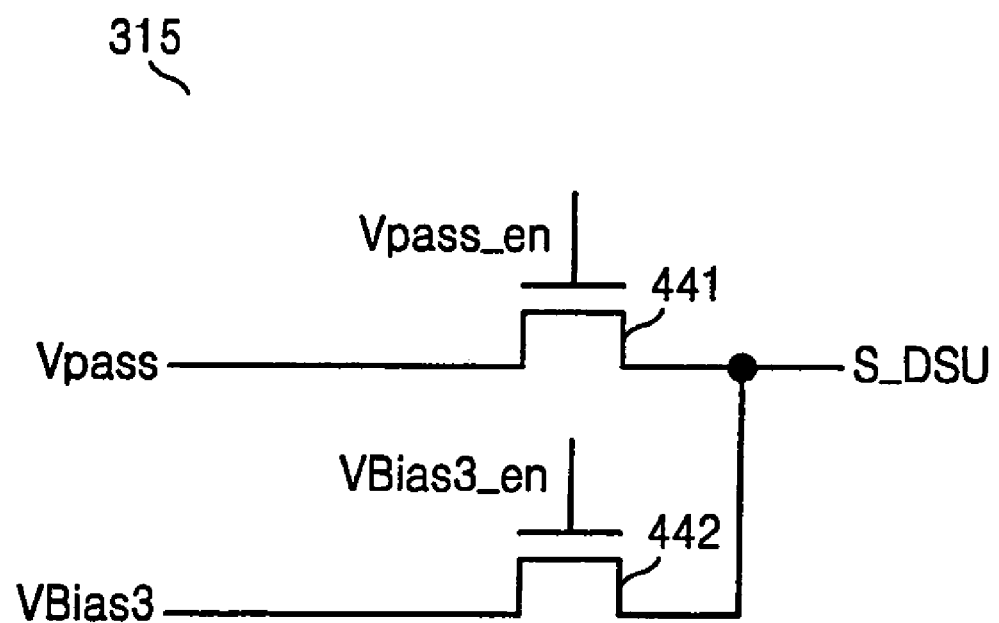
FIG. 4E illustrates a second dummy global wordline decoder illustrated in FIG. 3.

The second dummy global wordline decoder 315 may select one from the voltages (e.g., the program inhibit voltage Vpass and the upward bias voltage VBias3) output from the dummy wordline voltage generator 40, and may output a selected voltage S_DSU. The output voltage S_DSU may be applied to the second dummy wordline DWL2 connected to the second dummy cell 208. FIG. 4E illustrates the second dummy global wordline decoder 315 illustrated in FIG. 3. Referring to FIG. 3 and FIG. 4E, the second dummy global wordline decoder 315 may include two switching transistors 441 and 442 to selectively apply the program inhibit voltage Vpass and the upward bias voltage VBias3 to the second dummy wordline DWL2. The switching transistors 441 and 442 may be turned on in response to enable signals Vpass_en and VBias3_en, respectively.

Thus, generally, the first type global wordline decoder may selectively apply n voltages, where n is an integer greater than or equal to three, and the second type global wordline decoder may selectively apply up to (n−1) voltages. In the particular example in FIG. 3, the first type global wordline decoder selectively applies five voltages, and the second type global wordline decoder selectively applies two or three voltages.

FIG. 5 illustrates a table showing switching transistors for the decoders 311 through 315 illustrated in FIG. 3 in the program mode according to some embodiments. FIG. 6 illustrates a table showing voltages applied to wordlines in the program mode according to some embodiments.

Referring to FIGS. 2, 3, 5, and 6, in some embodiments of the program mode, the first dummy global wordline decoder 311 applies the downward bias voltage VBias2 to the first dummy wordline DWL1 when the first wordline WL[0] is selected, applies the downward bias voltage VBias1 to the first dummy wordline DWL1 when the second wordline WL[1] is selected, and applies the program inhibit voltage Vpass to the first dummy wordline DWL1 when the other wordlines WL[2] through WL[31] and DWL[2] are selected. Accordingly, the first dummy global wordline decoder 311 may include three switching transistors Switch2 through Switch4 for switching the program inhibit voltage Vpass and the downward bias voltages VBias1 and VBias2, but may not include a switching transistor Switch1 for switching the program voltage Vpgm and a switching transistor Switch5 for switching the upward bias voltage VBias3.

In some embodiments of the program mode, the first edge global wordline decoder 312 applies the program voltage Vpgm to the first wordline WL[0] when the first wordline WL[0] is selected, applies the downward bias voltage VBias2 to the first wordline WL[0] when the second wordline WL[1] is selected, applies the downward bias voltage VBias1 to the first wordline WL[0] when the third wordline WL[2] is selected, and applies the program inhibit voltage Vpass to the first wordline WL[0] when the other wordlines DWL[1], DWL[2], and WL[3] through WL[31] are selected. Accordingly, the first edge global wordline decoder 312 may include four switching transistors Switch1 through Switch4 for switching the program voltage Vpgm, the program inhibit voltage Vpass, and the downward bias voltages VBias1 and VBias2, but may not include a switching transistor Switch5 for switching the upward bias voltage VBias3.

As illustrated in FIG. 6, in some embodiments of the program mode, the five voltages Vpgm, Vpass, VBias1, VBias2, and VBias3 are selectively applied to the wordlines WL[1] through WL[30]. Accordingly, the normal global wordline decoder 313 may include five switching transistors Switch1 through Switch5 for switching the program voltage Vpgm, the program inhibit voltage Vpass, the downward bias voltages VBias1 and VBias2, and the upward bias voltage VBias3

In some embodiments of the program mode, the second edge global wordline decoder 314 applies the program voltage Vpgm to the second edge wordline WL[31] when the second edge wordline WL[31] is selected, applies the upward bias voltage VBias3 to the second edge wordline WL[31] when the wordline WL[30] is selected, and applies the program inhibit voltage Vpass to the second edge wordline WL[31] when the other wordlines DWL[1], DWL[2], and WL[0] through WL[29] are selected. Accordingly, the second edge global wordline decoder 314 may include three switching transistors Switch1, Switch2, and Switch5 for switching the program voltage Vpgm, the program inhibit voltage Vpass, and the upward bias voltage VBias3, but may not include switching transistors Switch3 and Switch4 for switching the downward bias voltages VBias1 and VBias2.

In the program mode, the first dummy global wordline decoder 315 applies the upward bias voltage VBias3 to the second dummy wordline DWL2 when the second edge wordline WL[31] is selected and applies the program inhibit voltage Vpass to the second dummy wordline DWL2 when the other wordlines DWL1 and WL[0] through WL[30] are selected. Accordingly, the second dummy global wordline decoder 315 needs two switching transistors Switch2 and Switch5 for switching the program inhibit voltage Vpass and the upward bias voltage VBias3 and does not need the switching transistor Switch1 for switching the program voltage Vpgm and switching transistors Switch3 and Switch4 for switching the downward bias voltages VBias1 and VBias2.

Consequently, the first dummy global wordline decoder 311, the first edge global wordline decoder 312, the second edge global wordline decoder 314, and the second dummy global wordline decoder 315 may only include as many switching transistors as the number of voltages required for wordlines corresponding to each decoder, so that the layout area of the memory device may be reduced.

Figure 7:
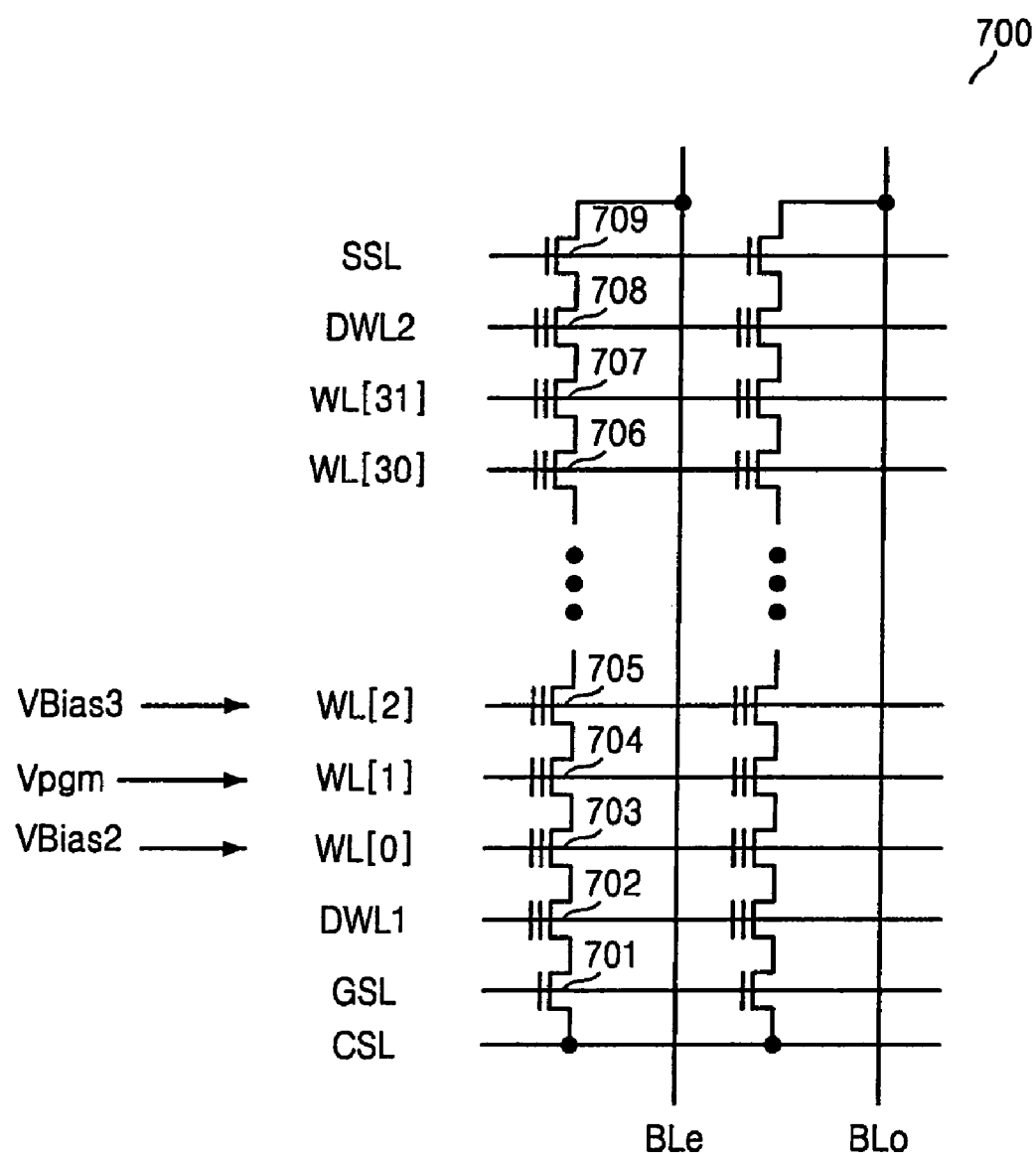
FIG. 7 illustrates voltages applied to a NAND flash string structure in the program mode, according to other embodiments of the present invention.

FIG. 7 illustrates voltages applied to a NAND flash string structure in the program mode, according to other embodiments of the present invention. The NAND flash string structure illustrated in FIG. 7 is different from that illustrated in FIG. 2 in that the adjacent non-selected cells 202, 203, and 205 include the two cells 202 and 203 below the selected cell 204 and the one cell 205 above the selected cell 204 in FIG. 2, but adjacent non-selected cells include one cell 703 below a selected cell 704 and one cell 705 above the selected cell 704 in FIG. 7. To avoid redundancy, only this difference will be described in detail below.

Programming may be performed by applying the program voltage Vpgm to a gate of the selected cell 704, i.e., the wordline WL[1] connected to the selected cell 704. The downward bias voltage VBias2 and the upward bias voltage VBias3 may be respectively applied to gates of the adjacent non-selected cells 703 and 705, thereby preventing the adjacent non-selected cells 703 and 705 from being programmed. The downward bias voltage VBias2 and the upward bias voltage VBias3 are lower than the program inhibit voltage Vpass. The program inhibit voltage Vpass may be applied to non-adjacent non-selected cells 702, 706, 707, and 708.

Figure 8:
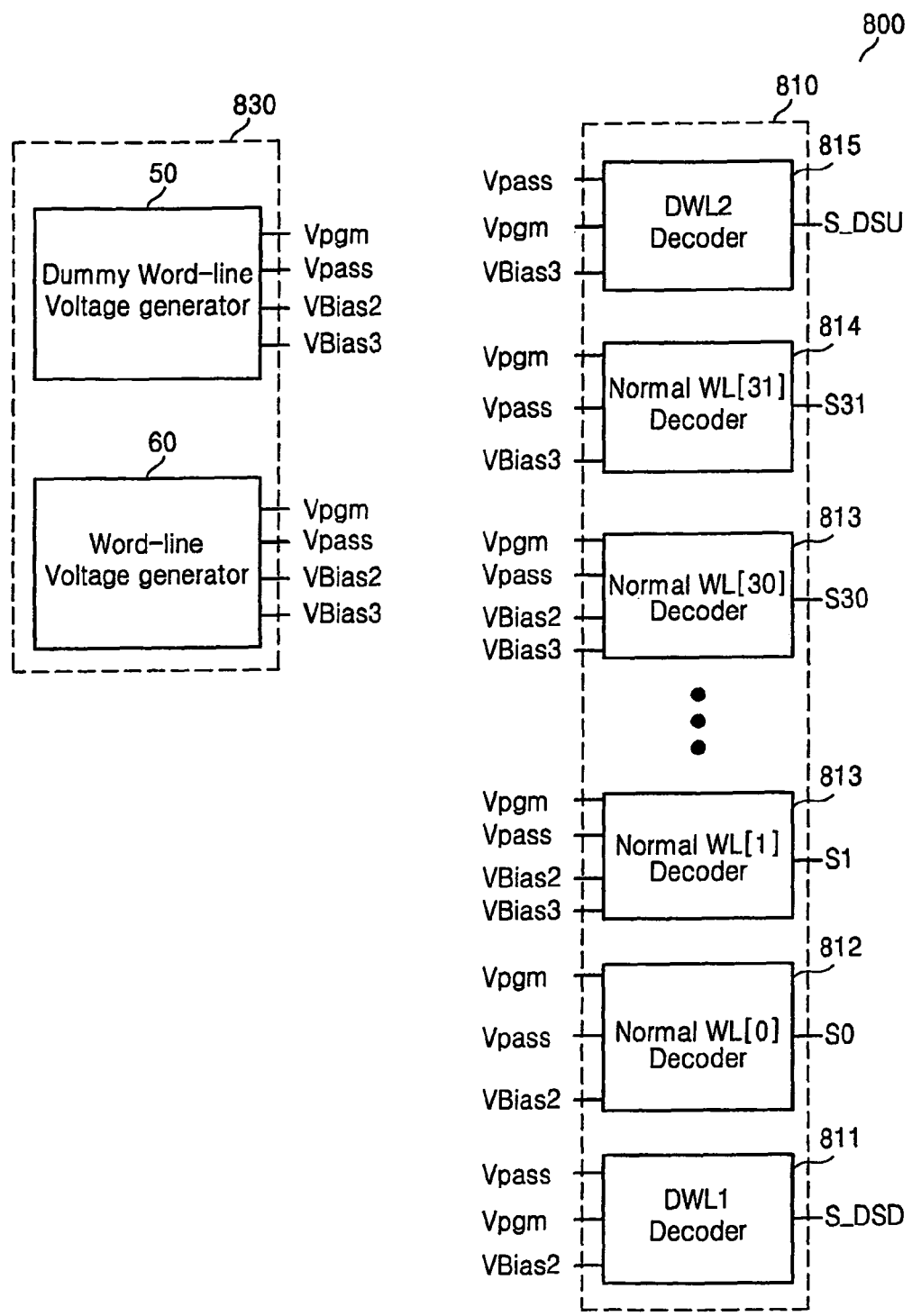
FIG. 8 illustrates a functional block diagram of a global wordline decoder and a voltage generator according to other embodiments of the present invention.

FIG. 8 illustrates a functional block diagram of a global wordline decoder 810 and a voltage generator 830 according to other embodiments of the present invention. The voltage generator 830 may include a dummy wordline voltage generator 50 and a wordline voltage generator 60. The program voltage Vpgm output from the dummy wordline voltage generator 50, i.e., a program voltage Vpgm applied when the dummy wordlines DWL1 and DWL2 are selected, may be is a post program voltage and may be different from the program voltage Vpgm applied when the normal wordlines WL[0] through WL[31] are selected.

The global wordline decoder 810 may include a first dummy global wordline decoder 811, a first edge global wordline decoder 812, a plurality of normal global wordline decoders 813, a second edge global wordline decoder 814, and a second dummy global wordline decoder 815.

The operations of the voltage generator 830 and the global wordline decoder 810 are the same as those of the voltage generator 330 and the global wordline decoder 310 illustrated in FIG. 3, with the exception that the voltage generator 830 does not output or switch the downward bias voltage VBias1 and the first and second dummy global wordline decoders 811 and 815 do output or switch the program voltage Vpgm. Thus, in the particular example in FIG. 8, the first type global wordline decoder selectively applies four voltages, and the second type global wordline decoder selectively applies three voltages.

FIG. 9 illustrates a table showing switching transistors required for the decoders 811 through 815 illustrated in FIG. 8 in other embodiments of the program mode. FIG. 10 illustrates a table showing voltages applied to wordlines in the program mode, according to other embodiments of the present invention.

Referring to FIGS. 7 through 10, in other embodiments of the program mode, the first dummy global wordline decoder 811 applies the downward bias voltage VBias2 to the first dummy wordline DWL1 when the first wordline WL[0] is selected, and applies the program inhibit voltage Vpass to the first dummy wordline DWL1 when the other wordlines WL[1] through WL[31] and DWL2 are selected. When the first dummy wordline DWL1 is selected, the first dummy global wordline decoder 811 applies the program voltage Vpgm to the first dummy wordline DWL1. Accordingly, the first dummy global wordline decoder 811 may include three switching transistors Switch1 through Switch3 for switching the program voltage Vpgm, the program inhibit voltage Vpass, and the downward bias voltage VBias2, and may not include a switching transistor Switch4 for switching the upward bias voltage VBias3.

In other embodiments of the program mode, the first edge global wordline decoder 812 applies the program voltage Vpgm to the first edge wordline WL[0] when the first edge wordline WL[0] is selected, applies the downward bias voltage VBias2 to the first edge wordline WL[0] when the second wordline WL[1] is selected, and applies the program inhibit voltage Vpass to the first edge wordline WL[0] when the other wordlines DWL1, DWL2, and WL[2] through WL[31] are selected. Accordingly, the first edge global wordline decoder 812 may include three switching transistors Switch1 through Switch3 for switching the program voltage Vpgm, the program inhibit voltage Vpass, and the downward bias voltage VBias2, and may not include the switching transistor Switch4 for switching the upward bias voltage VBias3.

The first dummy global wordline decoder 811 and the first edge global wordline decoder 812 may have substantially the same structure.

As illustrated in FIG. 10, the four voltages Vpgm, Vpass, VBias2, and VBias3 may be selectively applied to the normal wordlines WL[1] through WL[30] in other embodiments of the program mode. Accordingly, each of the normal global wordline decoders 813 may include four switching transistors Switch1 through Switch4 for switching the program voltage Vpgm, the program inhibit voltage Vpass, the downward bias voltage VBias2, and the upward bias voltage VBias3.

In other embodiments of the program mode, the second edge global wordline decoder 814 applies the program voltage Vpgm to the second edge wordline WL[31] when the second edge wordline WL[31] is selected, applies the upward bias voltage VBias3 to the second edge wordline WL[31] when the wordline WL[30] is selected, and applies the program inhibit voltage Vpass to the second edge wordline WL[31] when the other wordlines DWL1, DWL2, and WL[0] through WL[29] are selected. Accordingly, the second edge global wordline decoder 814 may include three switching transistors Switch1, Switch2, and Switch4 for switching the program voltage Vpgm, the program inhibit voltage Vpass, and the upward bias voltage VBias3, and may not include the switching transistor Switch3 for switching the downward bias voltage VBias2.

In other embodiments of the program mode, the second dummy global wordline decoder 815 applies the upward bias voltage VBias3 to the second dummy wordline DWL2 when the second edge wordline WL[31] is selected, and applies the program inhibit voltage Vpass to the second dummy wordline DWL2 when the other wordlines DWL1 and WL[0] through WL[30] are selected. The second dummy global wordline decoder 815 applies the program voltage Vpgm to the second dummy wordline DWL2 when the second dummy wordline DWL2 is selected. Accordingly, the second dummy global wordline decoder 815 may include three switching transistors Switch1, Switch2, and Switch4 for switching the program voltage Vpgm, the program inhibit voltage Vpass, and the upward bias voltage VBias3, and may not include the switching transistor Switch3 for switching the downward bias voltage VBias2.

The second dummy global wordline decoder 815 and the second edge global wordline decoder 814 may have substantially the same structure.

Consequently, the first dummy global wordline decoder 811, the first edge global wordline decoder 812, the second edge global wordline decoder 814, and the second dummy global wordline decoder 815 may only include as many switching transistors as the number of voltages required for wordlines corresponding to each decoder, so that the layout area of the memory device may be reduced.

Embodiments having three bias voltages(VBias1, VBias2, VBias3) applied to cells adjacent to a selected cell and embodiments having two bias voltages(VBias2, VBias3) applied to cells adjacent to the selected cell have been explained, but embodiments are not restricted thereto. For instance, the number of bias voltages set to be lower than a program inhibit voltage may and/or the number of second type wordline decoders may change.

According to the embodiments of the present invention, a non-volatile memory device may select one of a plurality of wordlines through a global wordline decoder, and the global wordline decoder may apply voltages necessary to perform a write/read operation through switching transistors.

If the global wordline decoder is not divided according to the number of voltages applied to the wordlines having the same structure with respect to every wordline, i.e., if as many switching transistors as the number of voltages output from a voltage generator are allocated to each of the wordlines, unnecessary switching transistors may be included, thereby increasing the layout area of the non-volatile memory device.

However, according to example embodiments of the present invention, the global wordline decoder may be divided into a plurality of decoders types according to the number of voltages applied to each of the wordlines. The plurality of decoder types may have different structures, so that the number of unnecessary switching transistors may be decreased. As a result, the layout area of the non-volatile memory device may be decreased.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A non-volatile memory device, comprising:
   a plurality of wordlines;
   a plurality of dummy-wordlines;
   a plurality of bitlines;
   a memory cell array including a plurality of memory cells having gates respectively connected to the plurality of wordlines and from which data is read via the plurality of bitlines;
   a first type global wordline decoder configured to selectively apply n different voltages, where n is an integer greater than or equal to three, to a corresponding wordline of the plurality of wordlines in a program mode; and
   a second type global wordline decoder configured to selectively apply up to (n−1) different voltages to a corresponding wordline of the plurality of wordlines in the program mode, the second type global wordline decoder having fewer switching elements than the first type global wordline decoder,
   wherein the n different voltages include a program voltage for programming a selected cell among the plurality of memory cells, a program inhibit voltage lower than the program voltage, and at least one bias voltage lower than the program inhibit voltage, and
   wherein the second type global wordline decoder includes an edge global wordline decoder configured to selectively apply up to (n−1) different voltages to a corresponding wordline among the plurality of wordlines in the program mode.

2. The non-volatile memory device as claimed in claim 1, wherein:
   the switching elements are implemented by switching transistors,
   the first type global wordline decoder includes a plurality of switching transistors configured to respectively switch the n different voltages, and
   the second type global wordline decoder includes a plurality of switching transistors configured to respectively switch up to (n−1) different voltages.

3. The non-volatile memory device as claimed in claim 1, wherein:
   the at least one bias voltage comprises a downward bias voltage applied to a first adjacent cell of the selected cell and a upward bias voltage applied to a second adjacent cell of the selected cell;
   the first and second global wordline decoders are configured to apply the program inhibit voltage to non-selected cells, which are not the selected cell, and first and second adjacent cells among the plurality of memory cells; and
   the edge global wordline decoder includes:
      a first edge global wordline decoder configured to selectively apply up to (n−1) different voltages, excluding at least the upward bias voltage, to a corresponding wordline among the plurality of wordlines in the program mode; and
      a second edge global wordline decoder configured to selectively apply up to (n−1) different voltages, excluding at least the downward bias voltage, to a corresponding wordline among the plurality of wordlines in the program mode.

4. The non-volatile memory device as claimed in claim 3, wherein:
   the plurality of memory cells comprises first through N-th memory cells connected in series in a string structure, where N is an integer greater than or equal to 2;
   the first edge global wordline decoder corresponds to a wordline connected to the first memory cell;
   the second edge global wordline decoder corresponds to a wordline connected to the N-th memory cell; and
   the first type global wordline decoder corresponds to wordlines connected to the second through (N−1)-th memory cells.

5. The non-volatile memory device as claimed in claim 4, wherein the first edge global wordline decoder and the second edge global wordline decoder have a same structure.

6. The non-volatile memory device as claimed in claim 4, further comprising a first dummy global wordline decoder for a first dummy cell and a second dummy global wordline decoder for a second dummy cell, wherein the plurality of memory cells further includes the first dummy cell connected to the first memory cell and the second dummy cell connected to the N-th memory cell.

7. The non-volatile memory device as claimed in claim 6, wherein:
   the first dummy global wordline decoder is configured to selectively apply up to (n−1) different voltages, excluding at least the upward bias voltage, to the respective one of the plurality of dummy-wordlines connected to the first dummy cell; and
   the second dummy global wordline decoder is configured to selectively apply up to (n−1) different voltages, excluding at least the downward bias voltage, to the respective one of the plurality of dummy-wordlines connected to the second dummy cell.

8. The non-volatile memory device as claimed in claim 6, wherein the first dummy global wordline decoder has the same structure as the first edge global wordline decoder, and the second dummy global wordline decoder has the same structure as the second edge global wordline decoder.

9. The non-volatile memory device as claimed in claim 1, wherein:
the plurality of memory cells comprises first through N-th memory cells connected in series in a string structure where N is an integer greater than or equal to 2; and
the at least one bias voltage includes a first downward bias voltage applied to the (i−1)-th memory cell and a first upward bias voltage applied to the (i+1)-th memory cell when the selected cell is the i-th memory cell among the first through N-th memory cells, where "i" is an integer and 1≦i≦N.

10. The non-volatile memory device as claimed in claim 9, wherein the edge global wordline decoder comprises:
a first edge global wordline decoder configured to selectively apply up to (n−1) different voltages, excluding at least the first upward bias voltage, to a corresponding wordline of the plurality of wordlines in the program mode; and
a second edge global wordline decoder configured to selectively apply up to (n−1) different voltages, excluding at least one of the first downward bias voltage to a corresponding wordline of the plurality of wordlines in the program mode.

11. The non-volatile memory device as claimed in claim 9, wherein:
the at least one bias voltage further comprises a second downward bias voltage applied to the (i−2)-th memory cell when the selected cell is the i-th memory cell among the first through N-th memory cells; and
the edge global wordline decoder includes:
a first edge global wordline decoder configured to selectively apply up to (n−1) different voltages, excluding at least the first upward bias voltage, to a corresponding wordline of the plurality of wordlines in the program mode; and
a second edge global wordline decoder configured to selectively apply up to (n−2) different voltages, excluding at least the first and second downward bias voltages, to a corresponding wordline of the plurality of wordlines in the program mode.

12. The non-volatile memory device as claimed in claim 9, further comprising a first dummy global wordline decoder for a first dummy cell and a second dummy global wordline decoder for a second dummy cell, wherein the plurality of memory cells further comprises the first dummy cell connected to the first memory cell and the second dummy cell connected to the N-th memory cell.

13. The non-volatile memory device as claimed in claim 12, wherein:
the first dummy global wordline decoder is configured to selectively apply up to (n−1) different voltages, excluding at least the upward bias voltage, to the respective one of the plurality of dummy-wordlines connected to the first dummy cell; and
the second dummy global wordline decoder is configured to selectively apply up to (n−1) different voltages, excluding at least the first downward bias voltage, to the respective one of the plurality of dummy-wordlines connected to the second dummy cell.

14. An operation method of a non-volatile memory device including a plurality of dummy-wordlines, a memory cell array, from which data is read via a plurality of bitlines, and which includes a plurality of memory cells having gates respectively connected to a plurality of wordlines, the operation method comprising:
selectively applying n different voltages, where n is an integer greater than or equal to three, to a first corresponding wordline among the plurality of wordlines in a program mode using a first type global wordline decoder; and
selectively applying up to (n−1) different voltages to a second corresponding wordline among the plurality of wordlines in the program mode using a second type global wordline decoder, the second type global wordline decoder having fewer switching elements than the first type global wordline decoder,
wherein n different voltages include a program voltage for programming a selected cell among the plurality of memory cells, a program inhibit voltage lower than the program voltage, and at least one bias voltage lower than the program inhibit voltage, and
wherein the second type wordline decoder includes an edge global wordline decoder configured to selectively apply the up to (n−1) different voltages to the second corresponding wordline among the plurality of wordlines in the program mode.

15. The operation method as claimed in claim 14, wherein:
the switching elements are implemented by switching transistors,
selectively applying n different voltages includes selectively enabling a plurality of switching transistors for respectively switching n different voltages and selectively applying n different voltages to the first corresponding wordline via a selectively enabled switching transistor, and
selectively applying up to (n−1) different voltages includes selectively enabling a plurality of switching transistors for respectively switching up to (n−1) different voltages and selectively applying up to (n−1) different voltages to the second corresponding wordline via a selectively enabled switching transistor.

16. The operation method as claimed in claim 14, further comprising providing the program inhibit voltage to non-selected cells, which are not the selected cell, and first and second adjacent cells among the plurality of memory cells.

17. The operation method as claimed in claim 14, wherein:
the at least one bias voltage includes a downward bias voltage applied to a first adjacent cell of the selected cell and a upward bias voltage applied to a second adjacent cell of the selected cell; and
selectively applying up to (n−1) different voltages, includes:
selectively applying up to (n−1) different voltages, excluding at least the upward bias voltage, to a corresponding wordline among the plurality of wordlines in the program mode, and
selectively applying up to (n−1) different voltages, excluding at least the downward bias voltage, to a corresponding wordline among the plurality of wordlines in the program mode.

18. The operation method as claimed in claim 17, further comprising:
selectively applying up to (n−1) different voltages, excluding at least the upward bias voltage, to the respective one of the plurality of dummy-wordlines connected to a first dummy cell; and selectively applying up to (n−1) different voltages, excluding at least the downward bias voltage, to the respective one of the plurality of dummy-wordlines connected to a second dummy cell.

19. The operation method as claimed in claim 17, wherein the downward bias voltage includes first and second downward bias voltages, and selectively applying up to (n−1) different voltages, excluding at least the downward bias voltage, includes selectively applying up to (n−2) different voltages, excluding at least the first and second downward bias voltages, to a corresponding wordline among the plurality of wordlines in the program mode.

20. The operation method as claimed in claim 19, further comprising:
- selectively applying up to (n−1) different voltages, excluding at least the upward bias voltage, to the respective one of the plurality of dummy-wordlines connected to a first dummy cell; and
- selectively applying up to (n−1) different voltages, excluding at least the first and second downward bias voltages, to the respective one of the plurality of dummy-wordlines connected to a second dummy cell.

* * * * *